(12) United States Patent
Matsunami

(10) Patent No.: US 7,113,047 B2
(45) Date of Patent: Sep. 26, 2006

(54) CLOCK GENERATOR AND ITS CONTROL METHOD

(75) Inventor: Hiroyuki Matsunami, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 12 days.

(21) Appl. No.: 10/968,005

(22) Filed: Oct. 20, 2004

(65) Prior Publication Data

US 2005/0275471 A1  Dec. 15, 2005

(30) Foreign Application Priority Data

Jun. 9, 2004 (JP) ............................. 2004-170867

(51) Int. Cl.
*H03L 7/08* (2006.01)

(52) U.S. Cl. .......................... 331/16; 331/23

(58) Field of Classification Search ................. 331/16, 331/23

See application file for complete search history.

(56) References Cited

U.S. PATENT DOCUMENTS 4,639,682 A * 1/1987 Takeuchi ..................... 329/307
5,598,130 A * 1/1997 Mesuda et al. .............. 332/119
5,705,955 A * 1/1998 Freeburg et al. ............... 331/14
6,650,193 B1 * 11/2003 Endo et al. ................... 331/78

FOREIGN PATENT DOCUMENTS

JP  2001-007700  1/2001

* cited by examiner

*Primary Examiner*—Joseph Chang
(74) *Attorney, Agent, or Firm*—Arent Fox PLLC

(57) ABSTRACT

To present a clock generator capable of spreading the spectrum of oscillation frequency by simple control in a small additional circuit, and its control method. A phase locked loop circuit is provided from a frequency phase comparator 11, an output clock signal PO is outputted from a voltage control oscillator (VCO) 14 by way of a charge pump circuit (CP) 12 and a loop filter (LF) 13, and is returned to the frequency phase comparator 11 by way of a frequency divider (DIV) 15. Detecting the phase difference of reference clock signal R and divided clock signal D, and locking the oscillation frequency of the output clock signal PO to specified frequency, a modulation signal M is outputted from a modulation pulse generator 1 regardless of phase locked control of phase locked loop circuit, and is superposed on phase comparison signal P, and thereby the oscillation frequency of output clock signal PO is modulated. An output clock signal PO having a predetermined spectrum spread characteristic can be obtained.

20 Claims, 12 Drawing Sheets

FIRST PRINCIPLE DIAGRAM OF PRESENT INVENTION

FIRST PRINCIPLE DIAGRAM OF PRESENT INVENTION

CIRCUIT DIAGRAM OF FIRST EMBODIMENT

WAVEFORM DIAGRAM OF FIRST EMBODIMENT

CIRCUIT DIAGRAM OF MODULATION PULSE GENERATOR

OPERATION WAVEFORM OF FIG.4

FIG. 6 CIRCUIT DIAGRAM OF SECOND EMBODIMENT

WAVEFORM DIAGRAM OF SECOND EMBODIMENT

SECOND PRINCIPLE DIAGRAM OF PRESENT INVENTION

CIRCUIT DIAGRAM OF THIRD EMBODIMENT

WAVEFORM DIAGRAM OF THIRD EMBODIMENT

CIRCUIT DIAGRAM OF BACKGROUND ART

WAVEFORM DIAGRAM OF BACKGROUND ART

CLOCK GENERATOR AND ITS CONTROL METHOD

BACKGROUND OF THE INVENTION

1. Field of the Invention

The present invention relates to a clock generator using PLL circuit, and its control method, and more particularly it relates to a clock generator for generating a clock signal of which oscillation frequency is spread in spectrum in order to decrease electromagnetic radiation due to high speed oscillation operation, and a control method thereof.

2. Description of the Related Art

As shown in FIG. 11, a PLL circuit disclosed in Japanese Laid-open Patent No. 2001-7700 comprises a PLL section 100 which is an ordinary PLL circuit for generating oscillation signal PO by operating so that the center frequency may be synchronized in phase with reference frequency signal R, and a dithering control section 200 for controlling dithering which is frequency modulation in specified frequency bandwidth by receiving supply of up signal UP or down signal DN and generating a changeover control signal CC for changing over the dividing ratio of DIV 150. The dithering control section 200 is composed of a latch circuit 210 for latching the state of up signal UP and down signal DN from PFD 11, and a charge pump circuit 220 for generating an additional charge pump signal PS.

In FIG. 12, supposing the center frequency of oscillation signal PO to be 100 MHz, the frequency of reference signal R to be 1 MHz, the basic dividing ratio of DIV 150 to be 100, and the frequency amplitude width to be +/−1 MHz, the operation is described below.

At a certain point T1, suppose the oscillation signal PO drops from the center frequency to 99 MHz. Dividing signal D (0.99 MHz) corresponding to dividing ratio 100 of DIV 150 is delayed in phase from reference signal R, and four pulses of up signal UP are outputted. In response to supply of up signal UP, CP 12 outputs positive charge pump signal PC. The dithering control section 200 outputs dividing ratio changeover control signal CC of L level, and one is added to the dividing ratio of DIV 150 to become 101. The frequency of the dividing signal D further declines from the frequency of reference signal R, and output of up signal UP continues from PFD 11. When the frequency of oscillation signal PO continues to rise until reaching 101 MHz, output of up signal UP from PFD 11 stops, and output of down signal DN starts. In response to supply of down signal DN, CP 12 outputs negative charge pump signal PC. The dithering control section 200 outputs dividing ratio changeover control signal CC of H level, and one is subtracted from the dividing ratio of DIV 150 to become 99. The frequency of the dividing signal D further exceeds the frequency of reference signal R, and output of down signal DN continues from PFD 11. When the frequency of oscillation signal PO continues to fall until reaching 99 MHz, output of down signal DN from PFD 11 stops. Thereafter, repeating the same operation, the oscillation signal PO is dithered within a desired frequency width 99 to 101 MHz.

SUMMARY OF THE INVENTION

In Japanese Laid-open Patent No. 2001-7700, however, in order to modulate the frequency of oscillation signal PO, the dithering control section 200 is needed in addition to the PLL section 100 as an ordinary PLL circuit. The dithering control section 200 is composed of a latch circuit 210 for latching the state of up signal UP and down signal DN from the PFD 11, and a charge pump circuit 220 for outputting an additional charge pump signal PS depending on the changeover control signal CC outputted from the latch circuit 210, and therefore the circuit scale is increased due to addition of the dithering control section 200.

Further, in addition to the charge pump circuit 12 of the PLL section 100, the dithering control section 200 also has the charge pump circuit 220, and the individual output signals, that is, the charge pump signal PC and additional charge pump signal PS are synthesized, and the synthesized charge pump signal PCS is put into the LPF 13, and the PLL operation is carried out. The PLL operation is controlled double by the two charge pump circuits 12, 220, and the control system is complicated, and it may be difficult to stabilize the oscillation frequency of the output signal PO.

The invention is devised to solve at least one of the problems of the background art, and it is hence an object thereof to present a clock generator capable of spreading the oscillation frequency in spectrum by easy control by addition of a small circuit scale, and its control method.

To achieve the object, the clock generator according to a first aspect of the invention comprises a phase comparator for outputting a phase comparison signal depending on a phase difference of output clock signal to reference clock signal, a phase locked loop circuit for synchronizing in phase with oscillation frequency depending on the reference clock signal by varying the oscillation frequency of the output clock signal depending on the phase comparison signal, and a modulator for outputting a modulation signal for modulating the oscillation frequency of the output clock signal superposed on the phase comparison signal.

In the clock generator of the first aspect of the invention, the phase locked loop circuit outputs a phase comparison signal depending on the phase difference of output clock signal to the reference clock signal, and when the oscillation frequency of the output clock signal is synchronized in phase with the oscillation frequency depending on the reference clock signal, the modulation signal outputted from the modulator is superposed on the phase comparison signal, and the oscillation frequency of output clock signal is modulated.

A control method of clock generator of the first aspect of the invention is characterized by modulating a phase comparison signal regardless of a phase difference, in the case of phase locked control of oscillation frequency of output clock signal to oscillation frequency depending on a reference clock signal, depending on the phase comparison signal showing the phase difference of the output clock signal to the reference clock signal, in a phase locked loop circuit.

Further, the control method of clock generator of the first aspect of the invention is characterized by using the phase locked loop circuit, and modulating the phase comparison signal regardless of the phase difference when controlling the oscillation frequency of output clock signal by synchronizing in phase to the oscillation frequency depending on the reference clock signal, after output of the phase comparison signal depending on the phase difference of output clock signal to the reference clock signal.

Accordingly, the phase comparison signal depending on the phase difference of output clock signal to the reference clock signal is outputted, and the oscillation frequency of output clock signal is synchronized in phase to the oscillation frequency corresponding to the reference clock signal, and therefore the phase comparison signal is modulated regardless of the phase difference, so that the oscillation frequency of the output clock signal can be modulated. By adjusting the modulation characteristic of the phase comparison signal, the spectrum spread characteristic of the output clock signal can be adjusted easily.

Modulation of phase comparison signal can be realized by superposition of the modulation signal, and the modulation signal can be outputted from the modulator. As compared with the background art in which the dithering control section 200 requires the latch circuit 210 and charge pump circuit 220, the additional circuit based on signal superposition by modulator and others can be small in scale.

Since the control of the PLL operation is composed of a single loop of phase locked loop circuit, and as compared with the background art of double loop composition of the PLL operation control, the control system can be simplified, and the oscillation frequency of output clock signal can be stabilized.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

Preferred embodiments of clock generator and its control method of the invention are described specifically below while referring to FIG. 1 to FIG. 10.

Figure 1:
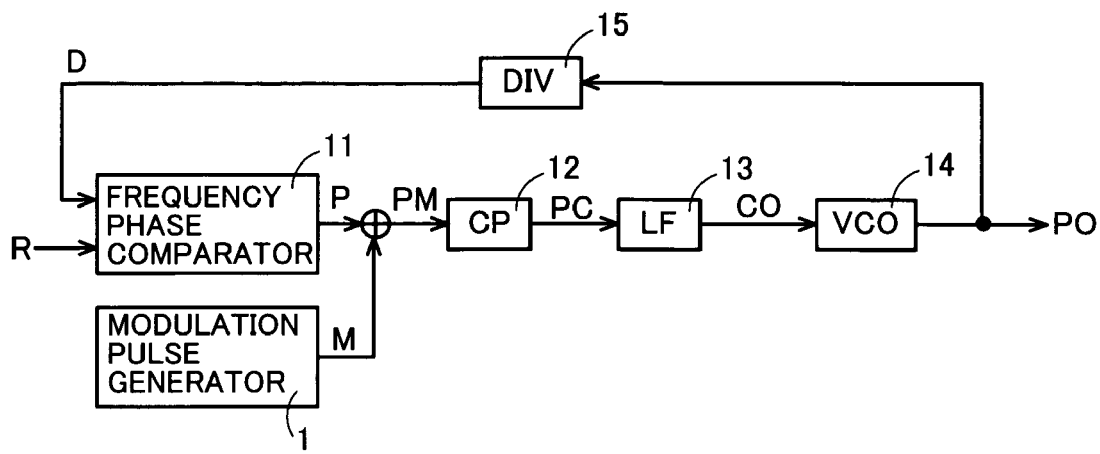
FIG. 1 is a first principle diagram of clock generator of the invention.

FIG. 1 is a first principle diagram of clock generator of the invention. Output clock signal PO is divided by a frequency divider (DIV) 15, and divided clock signal D is put in a frequency phase comparator 11. Further, reference clock signal R is put into the frequency phase comparator 11, and it is compared in phase with the divided clock signal D. The result of comparison is outputted as phase comparison signal P.

Modulation signal M is outputted from a modulation pulse generator 1, and is superposed on the phase comparison signal P. The phase comparison signal P is modulated by superposition of modulation signal M, and modulated phase comparison signal PM is put into charge pump circuit (CP) 12. In the charge pump circuit (CP) 12, electric charge is supplied and absorbed depending on the modulated phase comparison signal PM, and charge pump signal PC is outputted. The charge pump signal PC is smoothed by loop filter (LF) 13, and oscillation control signal CO is put into voltage control oscillator (VCO) 14. The voltage control oscillator (VCO) 14 outputs output clock signal PO at oscillation frequency depending on the voltage of the oscillation control signal CO.

From the frequency phase comparator 11, through charge pump circuit (CP) 12 and loop filter (LF) 13, output clock signal PO is outputted from the voltage control oscillator (VCO) 14, and output clock signal PO is returned to the frequency phase comparator 11 by way of frequency divider (DIV) 15, and thus a phase locked loop circuit is composed. The circuit configuration is the same as in the PLL section 100 of the background art. Detecting the phase difference of reference clock signal R and divided clock signal D, the phase is synchronized and controlled in a direction of canceling the phase difference, and the oscillation frequency of output clock signal PO is locked in a frequency corresponding to the oscillation frequency of the reference clock signal R, and thus the so-called PLL operation is controlled.

In the first principle diagram, regardless of phase locked control of phase locked loop circuit, by outputting modulation signal M from modulation pulse generator 1and superposing on phase comparison signal P, the oscillation frequency of output clock signal PO is modulated. By adjusting the modulation signal M in the modulation pulse generator 1, the modulation of the output clock signal PO can be adjusted, and an output clock signal PO having a predetermined spectrum spread characteristic can be obtained.

Figure 2:
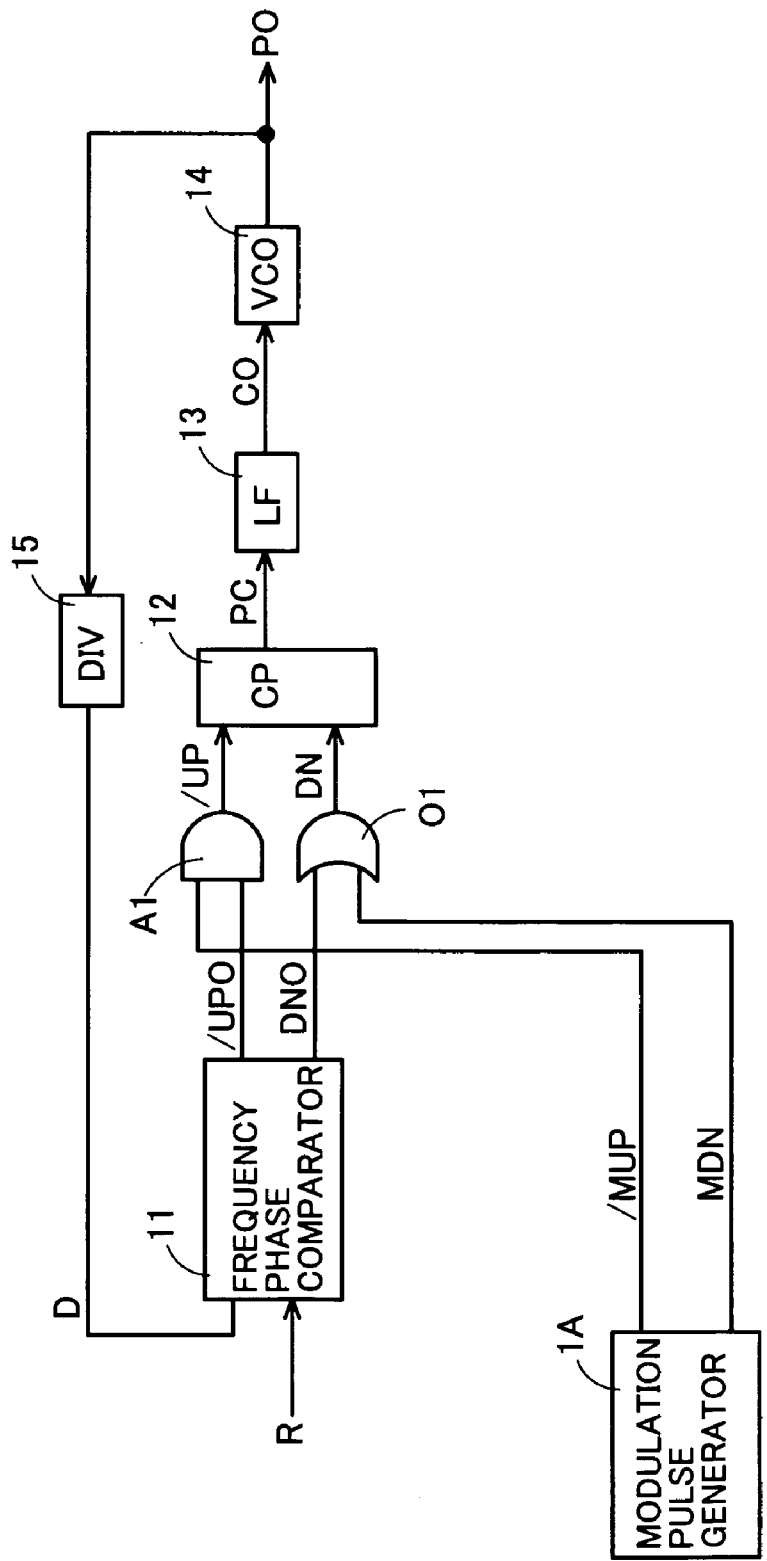
FIG. 2 is a circuit diagram of a first embodiment.

The clock generator in the first preferred embodiment shown in FIG. 2 has a circuit configuration conforming to the first principle diagram (FIG. 1). From frequency phase comparator 11, up signal /UP0 and down signal DN0 are outputted as phase comparison signal. Herein, the up signal /UP0 is defined to be a signal making low level effective, and the down signal DN0 to be a signal making high level effective. If the phase of divided clock signal D is delayed from reference clock signal R, the up signal /UP0 is outputted, and a command is outputted to advance the phase of output clock signal PO. If the phase of divided clock signal D is advanced, the down signal DN0 is outputted, and a command is outputted to delay the phase of output clock signal PO.

The charge pump (CP) 12 is generally composed to receive both up signal and down signal. For example, in the case of input of up signal, the electric charge is supplied, and the charge pump signal PC is smoothed, and the potential of the oscillation control signal CO is raised. The oscillation frequency of output clock signal PO outputted from the voltage control oscillator (VCO) 14 is raised, and the phase delay is decreased. In the case of input of down signal, the electric charge is absorbed, and the charge pump signal PC is smoothed, and the potential of the oscillation control signal CO is lowered. The oscillation frequency of output clock signal PO outputted from the voltage control oscillator (VCO) 14 is lowered, and the phase advance is decreased.

The clock generator of the first preferred embodiment has a modulation pulse generator 1A, and first modulation signal /MUP and second modulation signal MDN are outputted corresponding to up signal /UP0 and down signal DN0 respectively. Herein the first modulation signal /MUP is defined to be a signal making low level effective, and the second modulation signal MDN to be a signal making high level effective.

The up signal /UP0 and first modulation signal /MUP are operated in AND circuit A1, and modulation up signal /UP is outputted and is put into the charge pump circuit (CP) 12.

Herein, the up signal /UP0, first modulation signal /MUP, and modulation up signal /UP are signals making low level effective, and hence AND of the two signals is outputted from the AND circuit A1. That is, when the signal level of at least one of up signal /UP0 and first modulation signal /MUP is at low level, the modulation up signal /UP becomes low level, and a command for advancing the phase is put into the charge pump circuit (CP) 12.

The down signal DN0 and second modulation signal MDN are operated in OR circuit O1, and modulation down signal DN is outputted and is put into the charge pump circuit (CP) 12. Herein, the down signal DN0, second modulation signal MDN, and modulation down signal DN are signals making high level effective, and hence OR of the two signals is outputted from the OR circuit O1. That is, when the signal level of at least one of down signal DN0 and second modulation signal MDN is at high level, the modulation down signal DN becomes high level, and a command for delaying the phase is put into the charge pump circuit (CP) 12.

Accordingly, in the phase locked loop circuit, the first and second modulation signals /MUP and MDN outputted from the modulation pulse generator 1A are superposed on the up signal /UP0 and down signal DN0 which are phase comparison signals in phase locked control operation. In addition to phase locked control by the up signal /UP0 and down signal DN0 which are phase comparison signals, by the first and second modulation signals /MUP and MDN, the phase advance and phase delay are controlled forcibly. In the period of forced phase advance control, as the supply of electric charge from the charge pump circuit (CP) 12 continues, the voltage level of the oscillation control signal CO is raised. As a result, the oscillation frequency of the output clock signal PO is raised. In the period of forced phase delay control, as the absorption of electric charge into the charge pump circuit (CP) 12 continues, the voltage level of the oscillation control signal CO is lowered. As a result, the oscillation frequency of the output clock signal PO is lowered.

Figure 3:
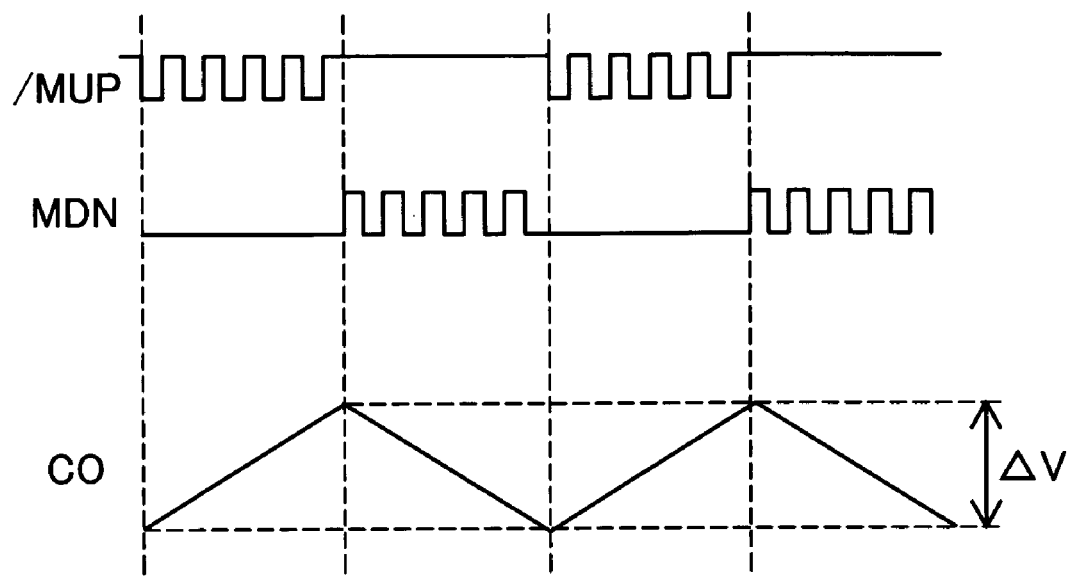
FIG. 3 is an operation waveform diagram of the first embodiment.

Specific operation waveforms are shown in FIG. 3. In every predetermined period, first modulation signal /MUP and second modulation signal MDN are outputted. Output of signals is intermittent at predetermined pulse width, and the total signal output time in predetermined period is adjusted to be the same between the first modulation signal /MUP and second modulation signal MDN.

Hence, in the output period when the first modulation signal /MUP is at low level, the modulation up signal /UP is intermittently outputted at predetermined pulse width. The charge pump circuit (CP) 12 supplies the electric charge intermittently, and a charge pump signal PC is outputted. The charge pump signal PC is smoothed by the loop filter (LF) 13, and an oscillation control signal CO for raising the potential at specified gradient is outputted. In the output period when the second modulation signal MDN is at high level, the modulation down signal DN is intermittently outputted at predetermined pulse width. The charge pump circuit (CP) 12 absorbs the electric charge intermittently, and a charge pump signal PC is outputted. The charge pump signal PC is smoothed by the loop filter (LF) 13, and an oscillation control signal CO for lowering the potential at specified gradient is outputted.

It is herein important that the rising voltage width and falling voltage width of oscillation control signal CO are identical. In FIG. 3, the oscillation control signal CO is vibrating at voltage width of $\Delta V$. Since the voltage control oscillator (VCO) 14 outputs an output clock signal PO at oscillation frequency corresponding to the voltage value of oscillation control signal CO, it is necessary that the oscillation control signal CO should vary at specified voltage width $\Delta V$ in order to obtain spectrum spread for repeating frequency variations at specified frequency width, from the oscillation frequency locked in the phase locked loop circuit on the basis of oscillation frequency of reference clock signal R.

Figure 4:
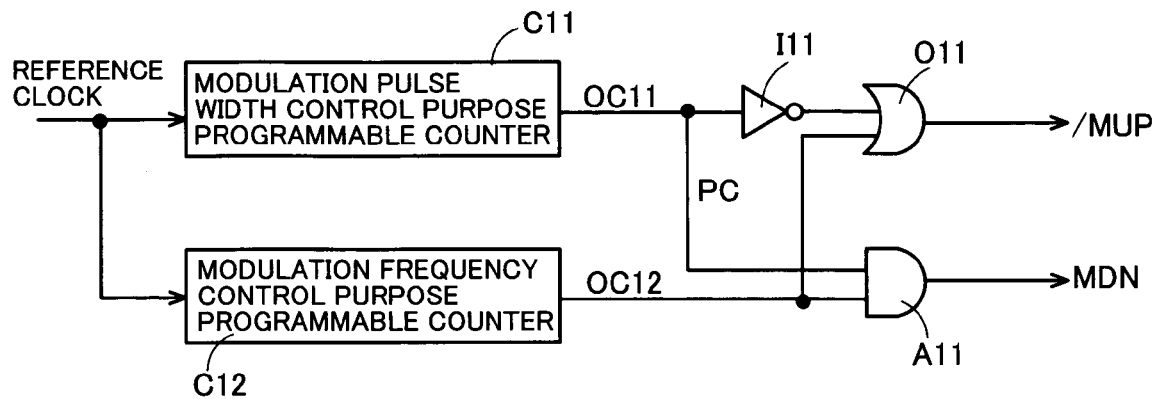
FIG. 4 is a circuit diagram of modulation pulse generator.
Figure 5:
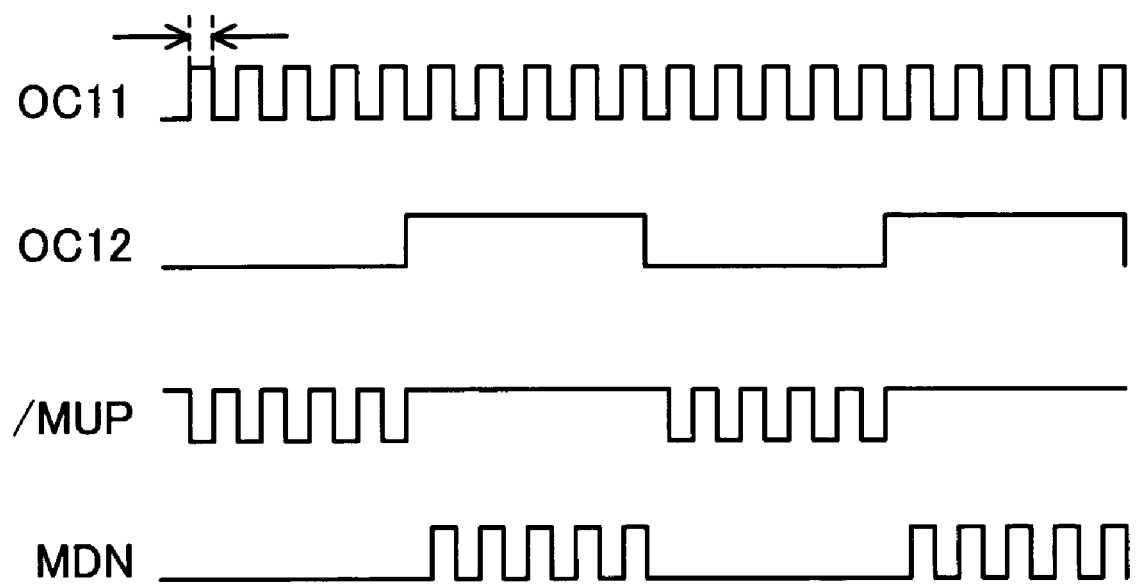
FIG. 5 is an operation waveform diagram of modulation pulse generator.

FIG. 4 shows a circuit example of modulation pulse generator 1A. Its operation waveforms are shown in FIG. 5. The circuit comprises a modulation pulse width control purpose programmable counter C11 for establishing the individual pulse signals of modulation signals /MUP and MDN, and modulation frequency control purpose programmable counter C12 for determining the output period of first modulation signal /MUP and second modulation signal MDN. The modulation pulse width control purpose programmable counter C11 outputs a pulse width control signal OC11 oscillating at pulse width of modulation signals /MUP, MDN, and this signal is put into logic inverting circuit I11 and AND circuit A11. The modulation frequency control purpose programmable counter C12 outputs an output period control signal OC12 inverting in voltage level in every output continuous period of modulation signals /MUP, MDN, and this signal is put into OR circuit O11 and AND circuit A11. At other input terminal of OR circuit, the output terminal of the logic inverting circuit I11 is connected.

The OR circuit O11 outputs a signal of low level only when all input signals are at low level. That is, when output period control signal OC12 is at low level and pulse width control signal OC11 is at high level, an output signal of low level is obtained. This can be used as first modulation signal /MUP. The AND circuit A11 outputs a signal of high level only when all input signals are at high level. That is, when output period control signal OC12 is at high level and pulse width control signal OC11 is at high level, an output signal of high level is obtained. This can be used as second modulation signal MDN. The high level period of pulse width control signal OC11 outputted from the modulation pulse width control purpose programmable counter C11 corresponds to the output signal of modulation signal, and depending on the logic level of the output period control signal OC12 outputted from the modulation frequency control purpose programmable counter C12, the first and second modulation signals /MUP, MDN can be distinguished and controlled. Depending on the pulse width of pulse width control signal OC11, the output time of individual modulation signals can be adjusted, and by adjusting the period of output period control signal OC12, duration of high/low level, and time rate of two levels, each period of phase advance control and delay control, duration, and time rate can be adjusted.

In FIG. 5, the oscillation signal of predetermined period is used as pulse width control signal OC11, but the invention is not limited to this example alone. As described below, it is also possible to output signal waveforms varying in the pulse width depending on the time, such as PWM waveforms.

Figure 6:
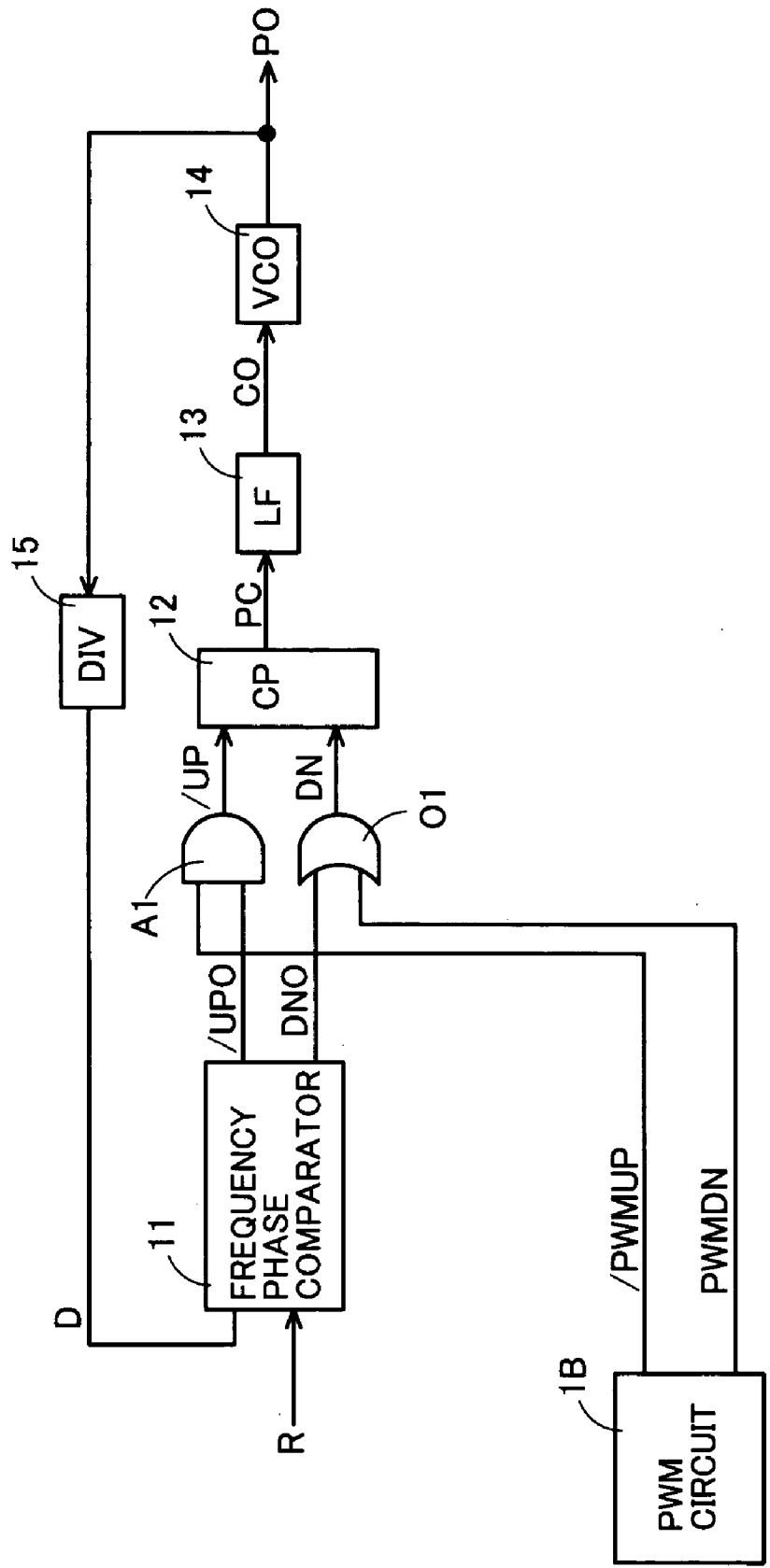
FIG. 6 is a circuit diagram of a second embodiment.

A clock generator in a second preferred embodiment shown in FIG. 6 has a circuit configuration conforming to the first principle diagram (FIG. 1). Instead of the modulation pulse generator 1A in the first preferred embodiment, a PWM circuit 1B is provided. Corresponding to up signal /UP0 and down signal DN0, first modulation signal /PWMUP and second modulation signal PWMDN are outputted. The first modulation signal /PWMUP is defined to be a signal making low level effective, and the second modulation signal PWMDN to be a signal making high level effective. These signals /PWMUP, PWMDN are signals outputted after PWM control, and are changed in pulse width in every pulse.

Figure 7:
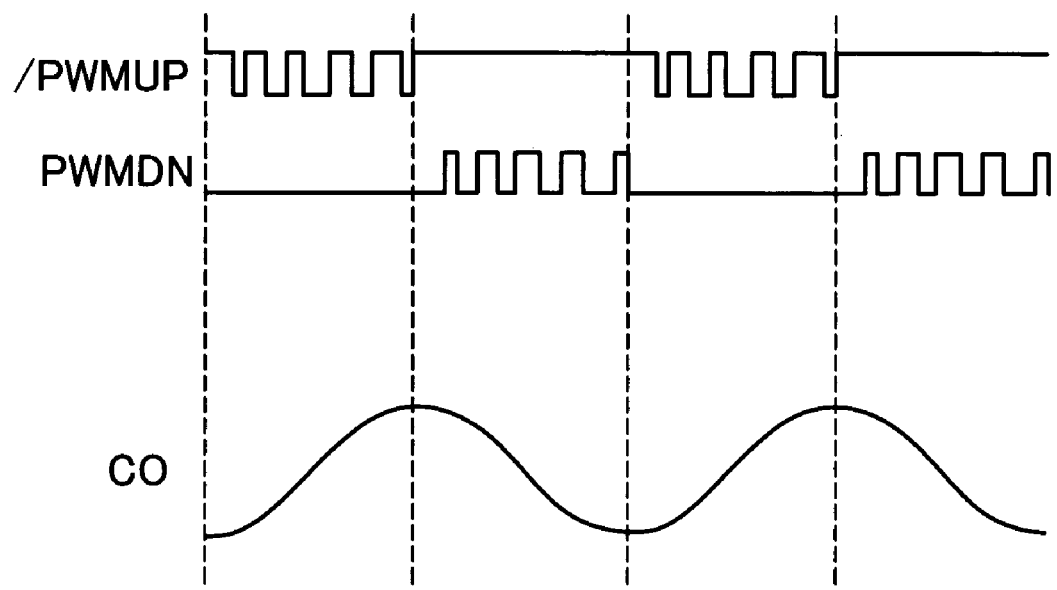
FIG. 7 is an operation waveform diagram of the second embodiment.

More specifically, as shown in FIG. 7, at the beginning and end of a predetermined period or output period, pulse signals of low duty of narrow pulse width are outputted, and in the middle of a predetermined period, a pulse signal of high duty of broad pulse width is outputted. In the process changing from beginning to middle, from middle to end, the signal waveform increases or decreases in the pulse width depending on the time.

Accordingly, the voltage gradient of voltage level of oscillation control signal CO is gentle at the beginning and end, and steepest in the middle of predetermined period, and the gradient changes with the time in the intermediate region, thereby forming a curve or folded line similar to sinusoidal curve.

Same as in the first embodiment, the total signal output time in the predetermined period is the same in the first modulation signal /PWMUP and second modulation signal PWMDN, and the rising voltage width and falling voltage width of oscillation control signal CO is the same voltage width.

In the first preferred embodiment, supposing the pulse width and pulse duty of the first and second modulation signals /MUP and MDN to be constant, the voltage level of the oscillation control signal CO is shown to go up and down at a specified gradient, and in the second preferred embodiment, supposing the pulse width and pulse duty of the first and second modulation signals /PWMUP and PWMDN to be narrow at the beginning and end of predetermined period, and widest in the middle of the predetermined period, the voltage gradient of voltage level is gentle at the beginning and end, and steepest in the middle of predetermined period, and the oscillation control signal CO draws a curve similar to sinusoidal curve, but the invention is not limited to these examples. At least, the voltage fluctuation width ΔV of oscillation control signal CO should be identical in the voltage ascending time and voltage descending time, fluctuating periodically within the voltage fluctuation width ΔV. As a result, the output clock signal PO varies periodically within a range of specified oscillation frequency width including lock frequency, and the spectrum spread characteristic is realized. Depending on the shape of the variation waveform of oscillation control signal CO, the spectrum spread characteristic as seen on the frequency axis can be properly adjusted.

In the invention, meanwhile, the operation maybe accompanied by forced variation of oscillation frequency synchronized in phase by modulation signal, and in such a case, depending on the degree of modulation, a signal in reverse direction may be outputted from the phase locked loop circuit. More specifically, as a result of progress of phase advance control depending on the first modulation signal /MUP, a down signal DN0 may be outputted from the frequency phase comparator 11. Or, as a result of progress of phase delay control depending on the second modulation signal MDN, an up signal /UP0 may be outputted from the frequency phase comparator 11. In such a case, too, the modulation operation can be continued by the modulation signal /MUP, MDN surpassing the control by the signal DN0, /UP0 from the frequency phase comparator 11.

Figure 8:
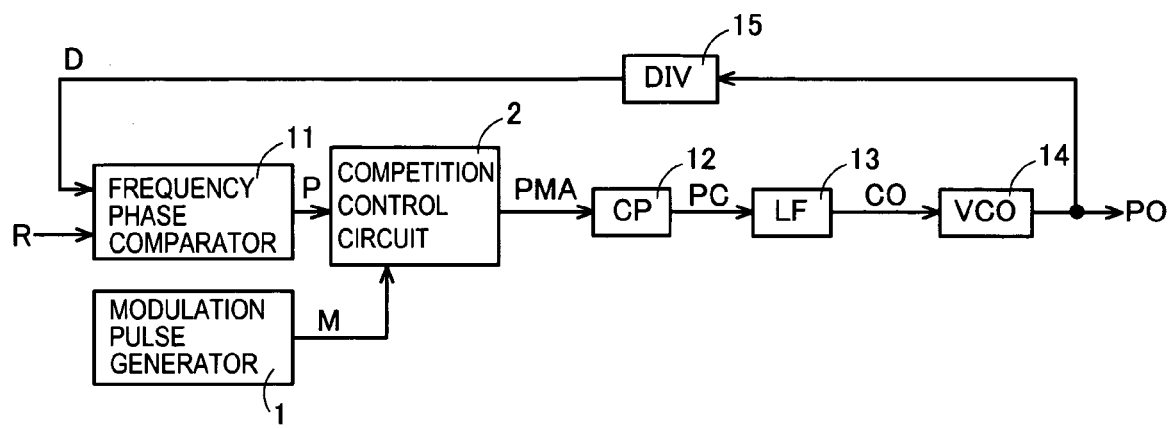
FIG. 8 is a second principle drawing of clock generator of the invention.

FIG. 8 is a second principle diagram of clock generator of the invention. In addition to the clock generator in the first principle diagram in FIG. 1, a competition control circuit 2 is provided. It receives phase comparison signal P outputted from the frequency phase comparator 11, and modulation signal M outputted from the modulation pulse generator 1, and adjusts the output timing of phase comparison signal P and modulation signal M, and controls to prevent duplication of output period of two signals. Competition control signal PMA controlled in competition is put into the charge pump circuit (CP) 12.

As mentioned above, since the operation may be accompanied by forced variation of oscillation frequency by modulation signal, depending on the case, phase locked control may be effected in reverse direction by phase locked loop circuit in the output period of modulation signal. It corresponds to a case of output of down signal DN0 in the period of phase advance control depending on first modulation signal /MUP, or a case of output of up signal /UP0 in the period of phase delay control depending on the second modulation signal MDN. The output period may be overlapped between the first modulation signal /MUP and down signal DN0, or the output period may be overlapped between the second modulation signal MDN and up signal /UP0, but when both signals are put into the charge pump circuit (CP) 12, supply operation of electric charge and absorption operation of electric charge are performed simultaneously in the charge pump circuit (CP) 12, and the supplied electric charge and absorbed electric charge may cancel each other, and phase locked control may not be carried out efficiently. Further, by flow of through-current from the high power supply potential to low power supply potential, the consumption current may be increased.

The competition control circuit 2 suppresses the output of phase comparison signal from the phase locked loop circuit into the charge pump circuit (CP) 12 in the output period of modulation signal, and hence prevent competition of phase locked control by modulation signal and phase locked control by phase comparison signal.

As a result, supply operation of electric charge and absorption operation of electric charge are not performed simultaneously in the charge pump circuit (CP) 12, and electric charge supply operation and electric charge absorption operation are performed effectively without waste. The response characteristic of charge pump signal PC by modulation signal is improved, and hence the modulation response characteristic of oscillation signal in output clock signal is also improved. Moreover, through-current is not generated by competition of electric charge supply and electric charge absorption, and the current consumption can be decreased.

Figure 9:
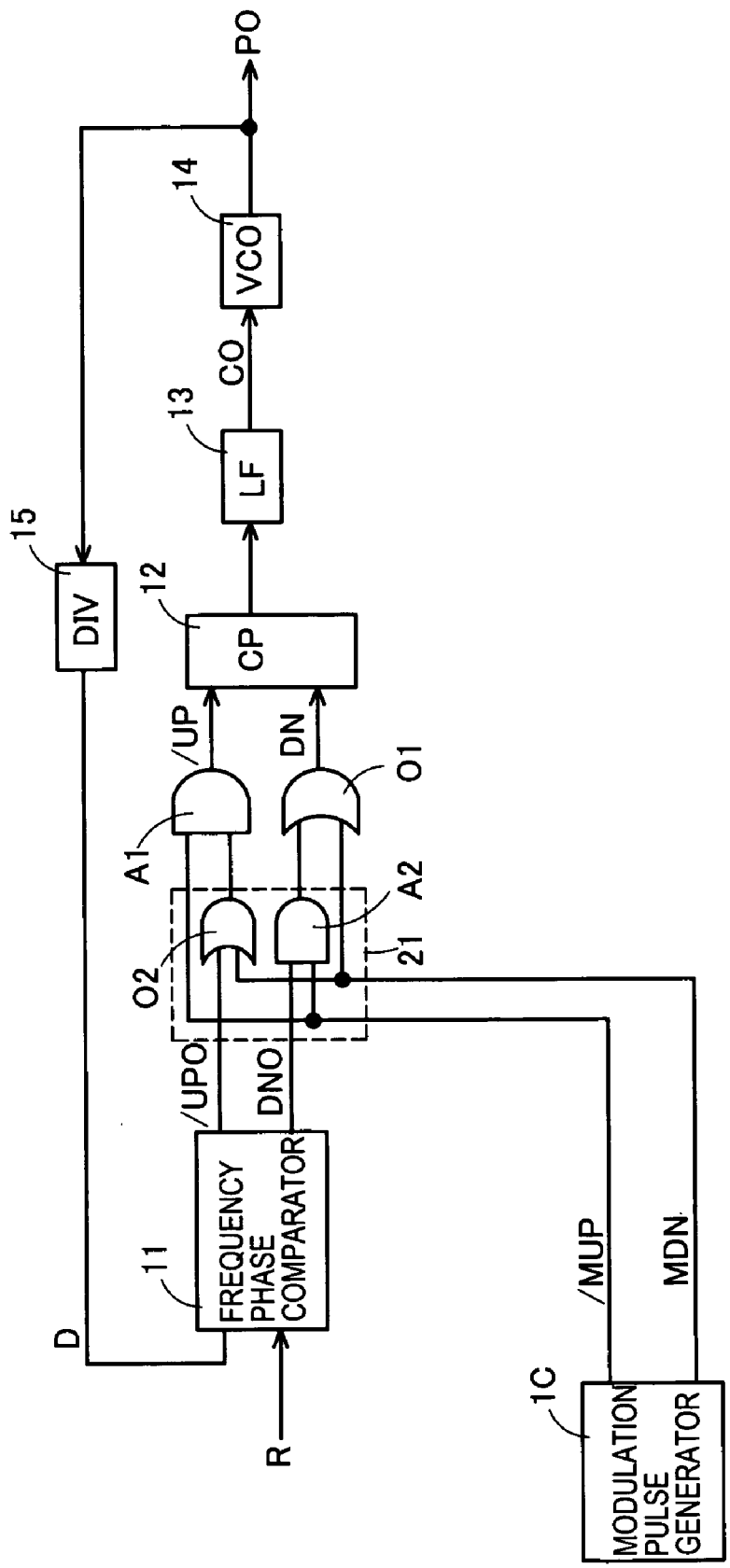
FIG. 9 is a circuit diagram of a third embodiment.

A clock generator in a third preferred embodiment shown in FIG. 9 has a circuit configuration conforming to the second principle diagram (FIG. 8). In addition to the clock generator in the first preferred embodiment, a competition control circuit 21 is provided. The competition control circuit 21 comprises an AND circuit A2 for receiving first modulation signal /MUP and down signal DN0, and an OR circuit O2 for receiving second modulation signal MDN and up signal /UP0, and the output terminal of AND circuit A2 is connected to OR circuit O1, and the output terminal of OR circuit O2 is connected to AND circuit A1. Same as in the first preferred embodiment, first modulation signal /MUP is put into other input terminal of AND circuit A1, and modulation up signal /UP is outputted. Similarly, second modulation signal MDN is put into other input terminal of OR circuit O1, and modulation down signal DN is outputted.

Figure 10:
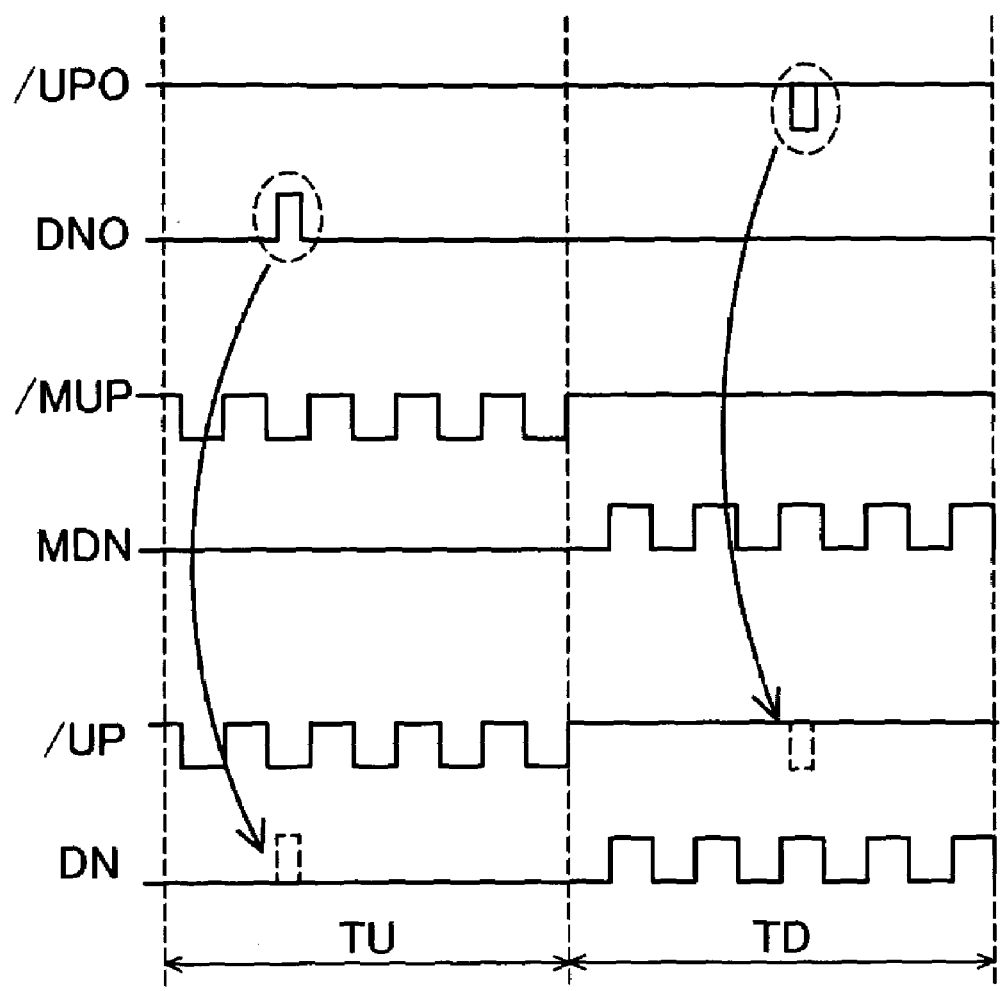
FIG. 10 is an operation waveform diagram of the third embodiment.
Figure 11:
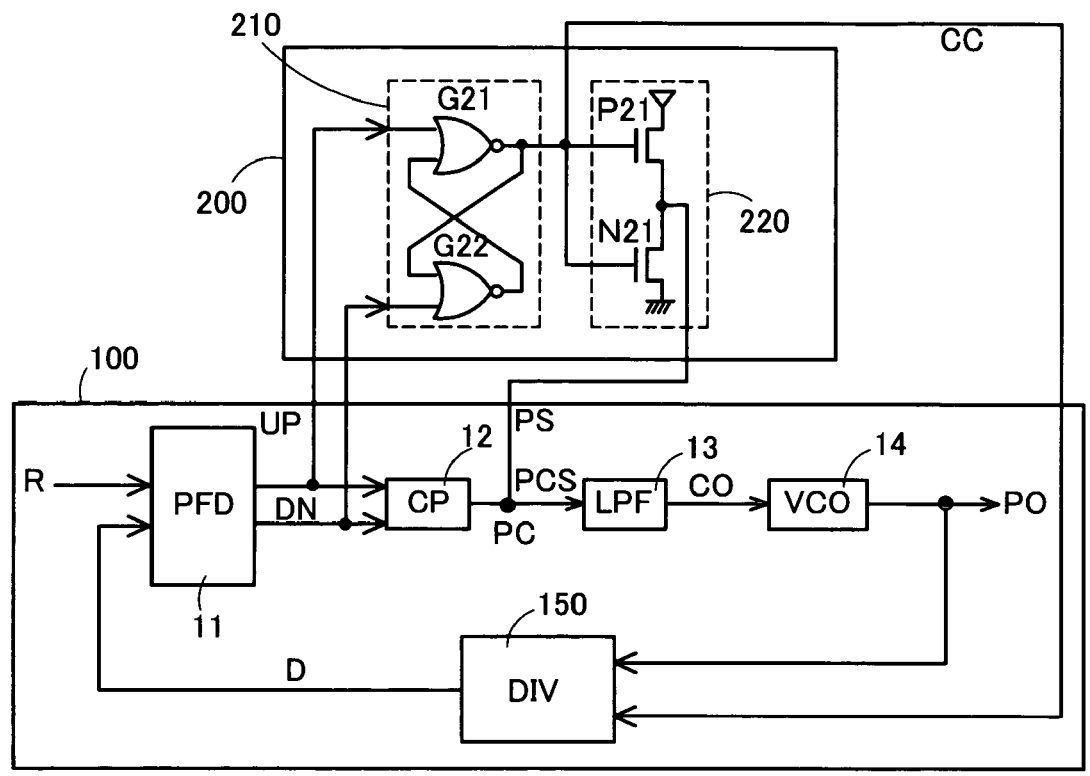
FIG. 11 is a circuit diagram of a background art.
Figure 12:
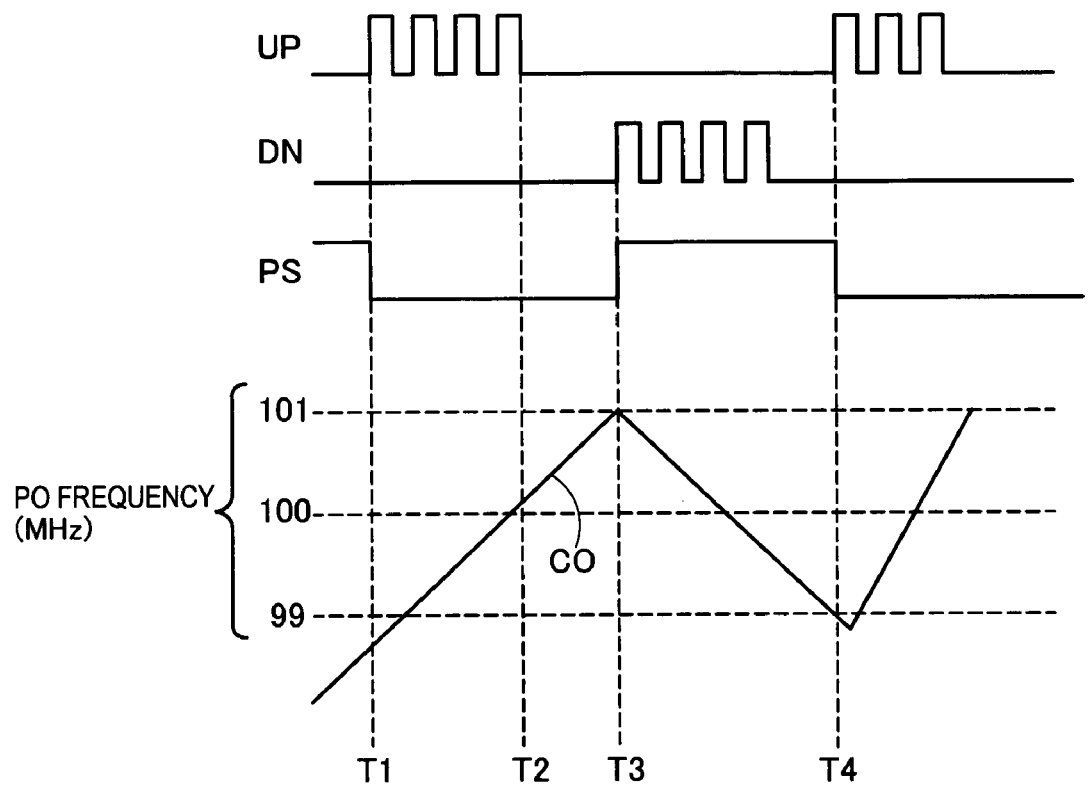
FIG. 12 is an operation waveform diagram of the background art.

In the competition control circuit 21, down signal DN0 is masked in the output period of first modulation signal /MUP, and up signal /UP0 is masked in the output period of second modulation signal MDN. Operation waveforms at this time are shown in FIG. 10.

In the output period of first modulation signal /MUP, by output of pulse signal as low level signal of predetermined width at predetermined interval, the charge pump circuit (CP) 12 operates to supply electric charge, and according to the first modulation signal /MUP of low level, the output signal level of AND circuit A2 is fixed at low level regardless of the signal level of down signal DN0. Still more, in this period, second modulation signal MDN is not outputted, and the low level is maintained. Therefore, the input signals into OR circuit O1 are both at low level, and the modulation down signal DN is maintained at low level. That is, the down signal DN0 of high level is masked, and the modulation down signal DN is maintained at low level showing an inactive state.

In the output period of second modulation signal MDN, by output of pulse signal as high level signal of specified width at predetermined interval, the charge pump circuit (CP) 12 operates to absorb electric charge, and according to the second modulation signal MDN of high level, the output level of OR circuit O2 is fixed at high level regardless of the signal level of up signal /UP0. Still more, in this period, first modulation signal /MUP is not outputted, and the high level is maintained. Therefore, the input signals into AND circuit A1 are both at high level, and the modulation up signal /UP is maintained at high level. That is, the up signal /UP0 of low level is masked, and the modulation up signal /UP is maintained at high level showing an inactive state.

In output period TU of intermittent output of low level pulse signal by first modulation signal /MUP, and in output period TD of intermittent output of high level pulse signal by second modulation signal MDN, in the high level period of first modulation signal /MUP and in the low level period of second modulation signal MDN, the charge pump circuit (CP) 12 does not perform supply operation or absorption operation of electric charge. In this period, the AND circuit A2 outputs a high level signal depending on down signal DN0 of high level, and the OR circuit O2 outputs a low level signal depending on up signal /UP0 of low level. These signals can be propagated to the charge pump circuit (CP) 12 as modulation down signal DN of high level and modulation up signal /UP of low level through the OR circuit O1 and the AND circuit A1.

Accordingly, in the output period of pulse signal of low level or high level showing the signal output state in modulation signal /MUP or MDN, by preventing propagation of down signal DN0 or up signal /MUP0 to charge pump circuit (CP) 12 which may disturb phase locked control by these signals, phase locked control by modulation signal can be executed securely, and unnecessary through-current in the charge pump circuit (CP) 12 can be prevented.

In addition, in the output period of pulse signal of high level or low level not showing the signal output state in modulation signal /MUP or MDN, the down signal DN0 or up signal /MUP0 by the frequency phase comparator 11 is propagated to the charge pump circuit (CP) 12, and phase locked control by phase locked loop circuit can be done securely.

As described specifically herein, according to the clock generator and its control method of the first and second preferred embodiments, the oscillation control signal CO can be varied at voltage width ΔV, and the oscillation frequency of the output clock signal PO can be varied by superposing the modulation signal M (FIG. 1) outputted from the modulation pulse generator 1, specifically, first and second modulation signals /MUP, MDN (FIG. 2) from the modulation pulse generator 1A or first and second modulation signals /PWMUP, PWMDN (FIG. 6) from the PWM circuit 1B (FIG. 6), on the phase comparison signal P (FIG. 1) in the phase locked loop circuit for performing phase locked control, that is, up signal /UP0, down signal DN0 (FIG. 2, FIG. 6).

By output of up signal /MUP0 and down signal MDN0 depending on the phase difference of divided clock signal D corresponding to the reference clock signal R, the oscillation frequency of output clock signal PO is synchronized in phase, and hence the oscillation frequency of the output clock signal PO can be modulated regardless of the up signal /MUP0, down signal MDN0. By adjusting the first and second modulation signals, the spectrum spread characteristic of the oscillation frequency of output clock signal PO can be adjusted easily.

The oscillation frequency can be adjusted by modulation of phase comparison signal, and the additional circuit for modulation of oscillation frequency may be smaller in scale, and further the phase locked control in PLL operation can be composed of a single loop of phase locked loop circuit, so that the control system can be simplified, and the oscillation frequency of output clock signal PO can be stabilized.

The phase locked loop circuit has AND circuit A1 for superposing up signal /MUP0 and first modulation signal /MUP or /PWMUP, and Or circuit O1 for superposing down signal DN0 and second modulation signal MDN or PWMDN, as signal superposing units. From the superposing units, the modulation up signal /UP and modulation down signal MDN are outputted as superposing signals, and put into the charge pump (CP) 12. As the signal superposing units, only a basic logic circuit is enough, and increase of circuit scale is only slight.

The modulation pulse generator 1A and PWM circuit 1B output first modulation signals /MUP, /PWMUP and second modulation signals MDN, PWMDN so that the phase advance amount and phase delay amount may be equal to each other in every predetermined period. As a result, the oscillation control signal CO can be varied at voltage width ΔV, and the spectrum spread characteristic of the output clock signal PO can be stabilized.

The first modulation signal /MUP which is modulation phase advance signal and second modulation signal MDN which is modulation phase delay signal are outputted as pulse signals having an equivalent time width in a predetermined period. Hence, the oscillation control signal CO raises or lowers the potential at specified gradient.

Further, the first modulation signal /PWMUP and second modulation signal PWMDN are outputted as pulse signals having mutually different time widths in a predetermined period. In this case, the pulse waveform is controlled in PWM so that the pulse width may be narrow at the beginning and end of predetermined period, and wide in the middle of predetermined period. Hence, the oscillation control signal CO having a curve similar to sinusoidal curve is obtained.

According to the clock generator and its control method of the third preferred embodiment of the invention, as shown in FIG. 8, a competition control circuit 2 is provided in order to suppress the output of phase comparison signal P in output period of modulation signal M. More specifically, as shown in FIG. 9, in the competition control circuit 21, propagation of down signal DN0 is suppressed in output period of first modulation signal /MUP, and propagation of up signal /UP0 is suppressed in output period of second modulation signal MDN. As a result, phase comparison signal P is not overlapped in output period of modulation signal M, and the response characteristic in phase locked control can be improved and the current consumption can be decreased.

The invention is not limited to the preferred embodiments alone, but may be changed and modified variously within a range not departing from the true spirit of the invention.

For example, in the preferred embodiments, the oscillation control signal CO is modulated, and the voltage waveform is shaped in triangular wave or nearly sinusoidal wave, but the invention is not limited to these waveforms. Desired modulation is possible by adjusting the modulation signal outputted from the modulation pulse generator 1.

In the competition control circuit 21, the down signal DN0 or up signal /MUP0 is not propagated to the charge pump circuit (CP) 12 during output of first modulation signal /MUP or second modulation signal MDN, but the invention is not limited to this circuit configuration. Similar effects are obtained by acting on the frequency phase comparator 11 and suppressing the output of signal.

The competition control circuit 21 can be also applied in the first and second preferred embodiments.

As described herein, the invention presents the clock generator and its control method capable of outputting the oscillation frequency of output clock signal by spectrum spread by modulating the phase comparison signal in the phase locked loop circuit.

What is claimed is:

1. A clock generator comprising:
   a phase comparator for outputting a phase comparison logic signal depending on a phase difference of output clock signal to reference clock signal,
   a phase locked loop circuit for synchronizing in phase with oscillation frequency depending on the reference clock signal by varying the oscillation frequency of the output clock signal depending on the phase comparison logic signal, and
   a modulator for outputting a modulation pulse signal superposed on the phase comparison logic signal for modulating the oscillation frequency of the output clock signal.

2. The clock generator of claim 1, wherein the phase locked loop circuit includes:
   a signal superposing unit for receiving the phase comparison signal and the modulation signal and outputting a superposed signal, and
   a charge pump circuit for receiving the superposed signal and adjusting the oscillation frequency of the output clock signal.

3. The clock generator of claim 2, wherein the phase comparison signal and the modulation signal are logic signals, and the signal superposing unit has an OR operation unit.

4. The clock generator of claim 1, wherein the modulator outputs the modulation signal so that a phase advance amount and a phase delay amount may be equal in a predetermined period.

5. The clock generator of claim 4, wherein the modulation signal has a modulation phase advance signal for commanding phase advance the modulation and a modulation phase delay signal for commanding phase delay modulation, and the modulation phase advance signal and modulation phase delay signal are outputted at a mutually equivalent time rate in the predetermined period.

6. The clock generator of claim 5, wherein at least one of the modulation phase advance signal and the modulation phase delay signal is outputted as pulse signal having an equivalent time width in the predetermined period.

7. The clock generator of claim 5, wherein at least one of the modulation phase advance signal and the modulation phase delay signal is outputted as pulse signal having an individually different time width in the predetermined period.

8. The clock generator of claim 7, wherein the pulse signal is PWM controlled signal.

9. The clock generator of claim 1, further comprising a competition control circuit for suppressing the output of the phase comparison signal in the output period of the modulation signal.

10. The clock generator of claim 9, wherein the phase comparison signal suppressing the signal output is a signal for canceling the phase modulation by the modulation signal.

11. The clock generator of claim 1, further comprising a frequency divider dividing the output clock signal and feeding into the phase comparator.

12. A method for controlling a clock generator comprising:
   outputting a phase comparison logic signal depending on a phase difference of output clock signal to reference clock signal;
   synchronizing in phase with oscillation frequency depending on the reference clock signal by varying the oscillation frequency of the output clock signal depending on the phase comparison logic signal; and
   outputting a modulation pulse signal superposed on the phase comparison logic signal for modulating the oscillation frequency of the output clock signal.

13. The control method of clock generator of claim 12, wherein the phase comparison signal is modulated so that a phase advance amount and a phase delay amount may be equivalent in a predetermined period.

14. The control method of clock generator of claim 12, wherein a modulation signal for modulating the oscillation frequency of the output clock signal is superposed on the phase comparison signal.

15. The control method of clock generator of claim 14, wherein the modulation signal has a modulation phase advance signal for commanding phase advance modulation and a modulation phase delay signal for commanding phase delay modulation, and the modulation phase advance signal and the modulation phase delay signal are outputted at a mutually equivalent time rate in the predetermined period.

16. The control method of clock generator of claim 15, wherein at least one of the modulation phase advance signal and the modulation phase delay signal is outputted as pulse signal having an equivalent time width in the predetermined period.

17. The control method of clock generator of claim 15, wherein at least one of the modulation phase advance signal and the modulation phase delay signal is outputted as pulse signal having an individually different time width in the predetermined period.

18. The control method of clock generator of claim 17, wherein the pulse signal is PWM controlled signal.

19. The control method of clock generator of claim 12, wherein the output of the phase comparison signal is suppressed in the output period of the modulation signal.

20. The control method of clock generator of claim 19, wherein the phase comparison signal suppressing the signal output is a signal for canceling the phase modulation by the modulation signal.

* * * * *